United States Patent [19]

Dinkler et al.

[11] 4,092,586
[45] May 30, 1978

[54] TEMPERATURE-SENSING CIRCUIT

[75] Inventors: Leonard R. Dinkler, Gainesville; Jerry Herrin, Alachua, both of Fla.

[73] Assignee: General Electric Company, Gainesville, Fla.

[21] Appl. No.: 623,781

[22] Filed: Oct. 20, 1975

[51] Int. Cl.² .................................................. G01R 31/02
[52] U.S. Cl. .............................. 324/28 RS; 335/208; 324/203; 324/234
[58] Field of Search ............... 335/208, 146, 207, 217; 324/34 RS, 28 RS

[56] References Cited

U.S. PATENT DOCUMENTS

| 3,295,081 | 12/1966 | Bowger et al. | 335/208 |
| 3,895,328 | 7/1975 | Kato | 335/208 |
| 3,903,492 | 9/1975 | Endo | 335/208 |

FOREIGN PATENT DOCUMENTS

| 1,813,907 | 4/1971 | Germany | 335/146 |

OTHER PUBLICATIONS

Lester R. Moskowitz, Selecting Magnets for Reed Switch Actuation, Automation, Oct. 1968, pp. 66–71.

*Primary Examiner*—M. Tokar
*Attorney, Agent, or Firm*—Morgan, Finnegan, Pine, Foley & Lee

[57] ABSTRACT

A temperature-responsive circuit comprising an ECTS reed switch and an interrogation means for determining the operability and accuracy of the temperature-responsive portion of the circuit.

8 Claims, 8 Drawing Figures

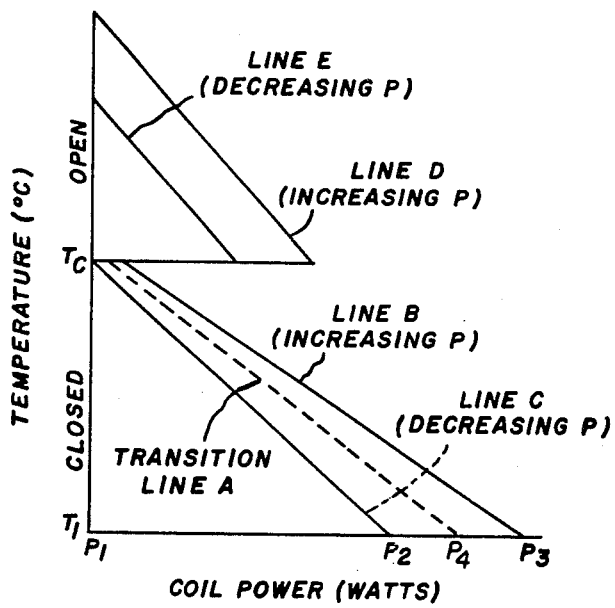
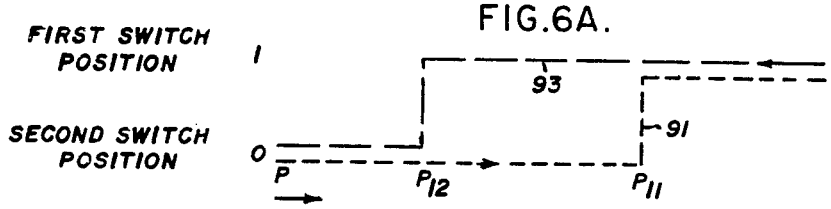
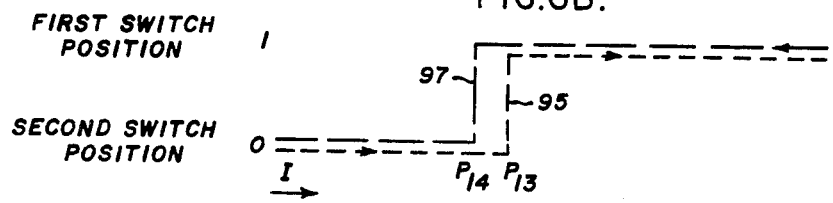
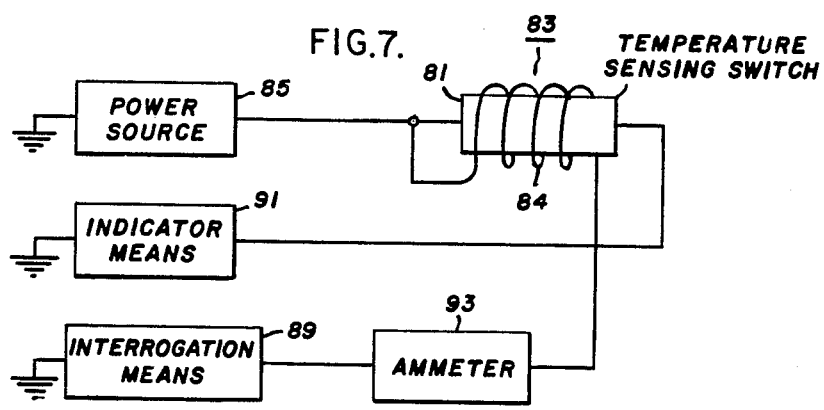

TEMPERATURE-SENSING CIRCUIT

CROSS REFERENCE TO RELATED APPLICATION

This application is related to application Ser. No. (60-BA-04) filed simultaneously herewith and assigned to the assignee of the invention herein.

BACKGROUND OF THE INVENTION

This invention relates to temperature sensing circuits and more particularly to such circuits with means for determining the operability of the sensing device.

Conventional reed switches have gained wide use in many industries because of (1) long life, (2) environmental isolation, and (3) repeatable switching performance under variety of ambient conditions. One recent use for reed switches has been as a temperature-sensitive switch, examples of which are disclosed in U.S. Pat. Nos. 3,649,936 and 3,812,441. Such devices are generally comprised of a conventional reed switch with a pair of doughnut-shaped or torroidal magnets mounted over the glass envelope of the reed switch.. A ferrite is mounted adjacent to the reed switch and the permanent magnets to form a magnetic circuit with the two permanent magnets.

Ferrites are magnetic materials having a temperature-dependent magnetic permeability and spontaneous magnetization. The properties of ferrites vary abruptly at a temperature denoted as the Curie temperature or point, which is defined as the temperature below which ferrites exhibit spontaneous magnetization and high permeability and the temperature above which these materials lose their spontaneous magnetization and have high reluctance.

Ferrites can be manufactured to have a stable, well-defined, and predetermined Curie temperature, such as between $-40°$ C and $+150°$ C, by properly setting the mixing ratio, manufacturing temperature, and forming pressure for ferrite materials such as manganese, copper, zinc, and iron. Because of the abrupt change in the characteristics of ferrites at the Curie temperature, these materials are useful in constructing temperature-sensitive reed switches of the type discussed hereinabove.

Heretofore in applications requiring a temperature-sensitive reed switch with a different Curie point, it has been necessary to substitute one switch for another which has been manufactured to have the appropriate Curie point. Such switching devices can be used for temperature-sensitive control of such devices as furnaces, water heaters, air conditioners, etc., or as temperature-monitoring devices of various types of electrical equipment, fire alarms, stoves, batteries, nuclear reactor components, machinery, etc.

One example which is illustrative of the problems which have been incurred with prior art temperature-monitoring systems is a warning device for over-temperature (O-T) conditions of aircraft batteries such as might occur during overcharging of the battery. The prior art devices are typically comprised of a temperature-sensitive switch mounted on the aircraft battery and an indicator which is electrically connected to the switch. The indicator is usually positioned at a location remote from the battery, such as in the cockpit of the airplane, to permit the temperature condition of the battery to be monitored in accordance with safety requirements. One problem of this device is that an indicator warning signal can be caused either by an actual O-T condition or a circuit malfunction such as a short circuit, an open circuit or a mechanical failure of the temperature-sensitive switch. Because of this uncertainty, it is desirable to be able to verify that the temperature-monitoring system is operating properly. One solution to this problem has been to merely duplicate the temperature-monitoring system, based on the theory that there is a low probability that both systems will simultaneously fail.

A related problem which occurs with these devices is created by the fact that it is often desirable or necessary to be able to periodically check (e.g., in preflight or bench tests) the accuracy of the temperature-sensing switch in detecting an O-T condition and initiating a warning signal in response thereto. One example of a trial procedure is to supply heat from an external supply to the switch and then measure with a temperature indicator, such as a thermometer, the ambient temperature of the switch contemporaneously with the initiation of a warning signal. If the battery or a heat-conduction path formed therewith is below a predetermined temperature, testing is sometimes difficult because the heat supplied from the external source could be drained off at a rate which would prevent the switch from being actuated. This commonly occurs in in-flight testing due to the fact that the air temperature is normally very low, such as for example, $-20°$ C. To overcome the problem of heat sinking, the most common trial procedure to check the accuracy is a maintenance procedure requiring the periodic removal and replacement of the switch with a substitute so that the original switch can be sent to a lab for testing.

Additional difficulties are also incurred in an in-flight test for either the actuality of an O-T condition and/or the accuracy of detection of an O-T condition. Although not practical, presently known testing require the reduction of the switch temperature to a temperature less than the switch actuation temperation. This is difficult because the battery, which is attached to the switch, is probably in the indicated O-T condition and thus is a heat source which would tend to maintain the switch in an O-T condition.

OBJECT OF THE INVENTION

An object of the invention is to provide an improved temperature-responsive circuit which has an interrogation means for determining the operability and accuracy of the circuit.

These and other objects of this invention will be apparent from a consideration of the detailed description and the accompanying claims.

SUMMARY OF THE INVENTION

An embodiment of the invention comprises a temperature-responsive circuit having an ECTS reed switch with an interrogation means for energizing the electromagnetic coil of the ECTS reed switch and initiating a switching action of the ECTS reed switch independently of the ambient temperature of the ECTS switch.

BRIEF DESCRIPTION OF THE DRAWING

FIG. 5 is a qualitative graph of the Curie temperature in degrees Centigrade of an exemplary ferrite for an ECTS reed switch as a function of the power in watts supplied to the electromagnetic coil of the ECTS reed switch.

FIG. 6(a) is a graph of the switching position of a conventional reed relay as a function of the power supplied to the relay coil of the reed relay.

FIG. 6(b) is a graph of the switching position of an ECTS reed switch relay as a function of the power supplied to the electromagnetic coil of the ECTS reed switch.

FIG. 7 is a block diagram of a temperature-monitoring circuit with an interrogation means for determining the operability of the temperature-sensing circuit in accordance with the invention herein.

DESCRIPTION OF THE PREFERRED EMBODIMENTS

Transition point will be used herein to refer to the change of a reed switch either from an open to a closed position or from a closed position to an open position, irrespective of the initial position of the switch.

Figure 1:
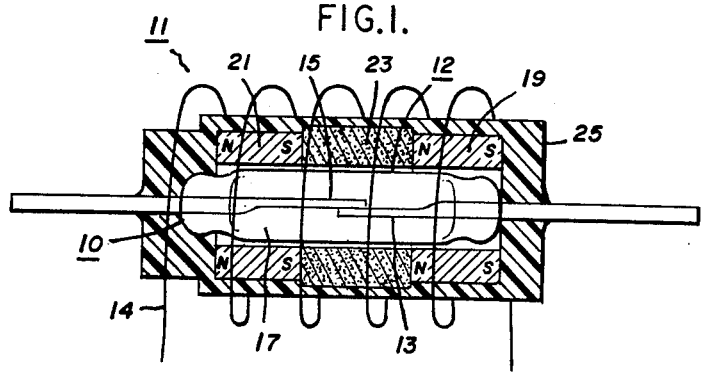
FIG. 1 is a partial, axial cross-section of an electromagnetically controlled temperature-sensitive reed switch constructed in accordance with the invention herein.

FIG. 1 shows a partial, axial, cross-sectional view of an electromagnetically controlled, temperature-sensitive (ECTS) reed switch 11 constructed in accordance with the features of the invention described and claimed in related application Ser. No. (60-BA-04). The ECTS reed switch 11 is generally comprised of a temperature-sensitive reed switch 12 and an electromagnetic coil 14 which is spirally wound around the exterior of the temperature-sensitive reed switch 12. For illustrative purposes, the coil 14 is shown in a plan view with the switch 12 being shown in an axial, cross-sectional view. The temperature-sensitive reed switch 12, which is of a conventional construction, such as is marketed by Hamilin, Inc., Lake Mills, Wis. Switch 12 is comprised of (1) single-pole, single-throw reed switch 10 having contact reeds 13, 15 which are sealed in a glass envelope 17, (2) a magnetic circuit formed by a pair of torroidal-shaped, permanent magnets 19, 21 and ferrite magnet 23, the poles of which are axially aligned, in the same direction, along the axis of the envelope 17, and (3) an epoxy protective coating 25 encapsulating the switch 10 and magnets 19, 21, 23.

Figure 2:
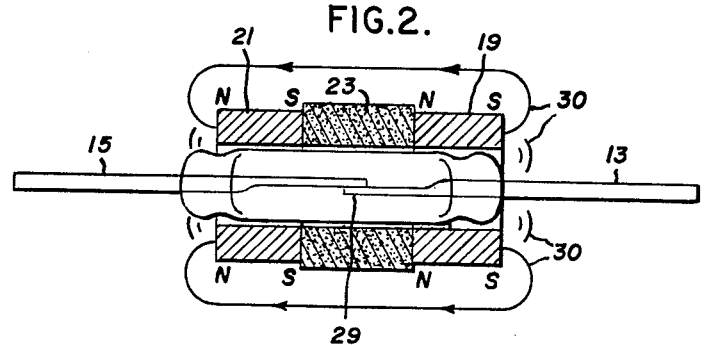
FIGS. 2 and 3 are axial, cross-sectional views, with parts omitted, of the switch of FIG. 1 to illustrate the magnetic flux lines of a magnetic circuit in accordance with the invention when the circuit is exposed to temperatures below and above, respectively, the Curie point of a ferrite in the magnetic circuit.
Figure 3:
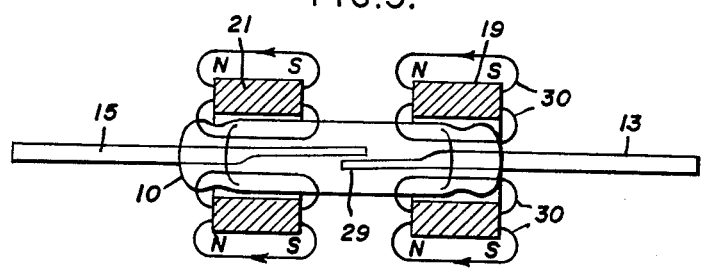

FIGS 2 and 3 illustrate (with the coil 14 omitted) the magnetic circuits formed by permanent magnets 19, 21 and ferrite 23 when the temperature of ferrite 23 is below and above its Curie point, respectively. When the temperature of the ferrite is below the Curie point (FIG. 2), the ferrite 23 has a high permeability and thereby forms a magnetic series circuit with permanent magnets 19 21. This causes the flux lines to pass through and oppositely polarize reeds 13, 15, thereby to bias reeds 13, 15 into contact.

When the tempature of the ferrite 23 is changed to a temperature above the Curie point, ferrite 23 is changed from a material of high permeability to a material of high reluctance. As a result, the magnetic series circuit (FIG. 2) between permanent magnets 19 and 21 via ferrite 23 is essentially open-circuited as shown in FIG. 3. The magnetic flux lines are now primarily confined about each individual permanent magnet 19 and 21 because of the high reluctance of ferrite 23. The magnetic field, as illustrated in FIG. 3 by the absence of flux lines, is weakened in a contact area 29 of the reed 13, 15, thereby to permit the contact of reeds 13, 15 to be broken by the cantilever spring force of the reeds 13, 15.

It will, of course, be understood by those skilled in the art that the invention herein is in no way limited to the single-pole, single-throw switch type illustrated in FIGS. 1–3 and that alternate, conventional reed switch types such as a single-pole, double-throw type can be used equally as well.

Additionally, other arrangements of permanent and ferrite magnets which can form an appropriate magnetic circuit for an ECTS reed switch in accordance with the features of this invention will be apparent to those skilled in the art. Examples of such alternative magnetic circuit designs are described in U.S. Pats. Nos. 3,649,936 and 3,812,441.

Figure 4:
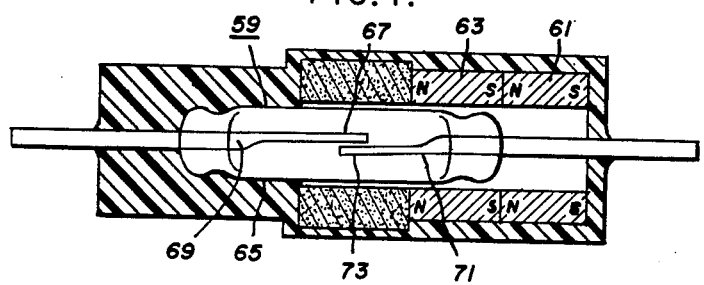
FIG. 4 is an axial, cross-sectional view of an alternative temperature-sensitive reed switch construction which may be used in accordance with the invention herein.

In FIG. 4, another alternative arrangement of permanent magnets and ferrites to provide the magnetic circuit for an ECTS reed switch is shown. The magnetic circuit is formed by (1) a pair of permanent magnets 61 and 63, which are disposed adjacent one another at one end of a glass envelope 65 of reed switch 59, and (2) a ferrite magnet 67, which is disposed centrally of reed switch 59 in an adjacent relationship with one end of permanent magnet 63. Similarly, as in the embodiment of FIG. 1, the poles of the magnets 61, 63, 67 are axially aligned in the direction along the axis of the switch 59. When the ferrite 67 has a high permeability (temperatures below its Curie point) and forms a magnetic series circuit with magnets 61, 63, the magnetic flux lines pass through the contact area 73 of reeds 69, 71, which causes the reeds 69, 71 to become the same polarity in the contact area 73 and to be biased into an open position. The closure of the reeds 71, 73 occurs when the ferrite 64 has a high reluctance (temperatures above the Curie point) and the magnetic circuit formed between the permanent magnets 61, 63, and ferrite 67 is open-circuited. The magnetic field set up in this situation by magnets 61, 63 does not extend over the contact area 73 and acts only to polarize reed 71 which thereby pulls reed 69 into contact therewith.

In accordance with a feature of this invention, the electromagnetic coil 14 is coiled around the exterior of a conventional temperature-sensitive reed switch 12 to form an ECTS reed switch 11 as shown in FIG. 1, the operation of which will now be discussed in regard to FIG. 5. FIG. 5 is a qualitative graph which is hypothesized to show the Curie point or temperature of an exemplary ferrite as a function of power supplied to the coil 14. As has been explained in connection with FIGS. 2 and 3, the Curie point of ferrite 23 determines the transition point of reed switch 10 (i.e., the point at which switch 10 changes back and forth between switch positions). Similarly, the graph of FIG. 5 is based upon the experimental observation of the ECTS switch transition points when the ECTS reed switch is subjected (1) to variable magnetic fields generated by coil 14 in the same direction as the magnetic fields produced by permanent magnets 19, 21; and (2) to variable ambient temperature conditions supplied, for example, by a liquid bath. In this example, an ECTS reed switch has been chosen which has a ferrite with a Curie point of 45° C in an ambient magnetic field consisting essentially of the magnetic fields of the Earth and permanent magnets 19, 21. This is represented by the point ($P_1=O$, $T_C$) on the graph which represents the traditionally identified Curie point of the ferrite. However, it has been observed that as power is supplied to the coil 14 (i.e., the external magnetic field is increased around the ferrite), the transition point is linearly reduced and intersects the P-axis at the point ($P_4,T_1$), thereby defining a transition line A as shown.

Such results have been hypothesized to evidence that the Curie point of a ferrite (i.e., the temperature at which a ferrite changes back and forth between a body having either high permeability or high reluctance) varies as a function of the externally applied magnetic field. (The magnetically induced transition points will hereinafter be referred to as "false Curie points").

From a theoretical standpoint, the effect of the external magnetic field on the ferrite is now understood so as to permit verification of the hypothesis that the Curie point varies as a function of the external magnetic field or that "false Curie points" are induced by an external magnetic field. However, this hypothesis is further strengthened by the fact that the transition points are approached by (1) increasing or (2) decreasing the power (magnetic field) to a valve which corresponds to an empirically predicted Curie point (transition point) which is equal to the ambient temperature of the ferrite. This fact is important because if the internal magnetic field of the coil 14 were merely vectorially cancelling the field of the permanent magnets, it might be expected that the transition points would vary, depending on whether approach (1) or (2) was used to reach a transition point as would ordinarily occur in the operation of a conventional reed relay.

Also supporting this hypothesis is the fact that the ECTS switch 12 can also be made to operate as a conventional reed relay as shown by the graph of FIG. 5. Thus, for values of temperature between $T_1$ and $T_C$ it has been found that a second transition, line B, is defined if power is increased from the values represented by transition line A. If the power is decreased from values above line B switch does not change position at line B but at line C. Similarly, for values of temperature above $T_C$ and for increasing and decreasing values of power transition lines D and E, respectively are defined. As will be explained in more detail hereinbelow, the operation of the switch 12 evidenced by lines B, C, D and E appear to be that of conventional electromagnetic reed switch relay.

As is well known in the prior art, conventional reed switch relays, which are typically comprised of (1) a reed switch, (2) one or more external, permanent magnets mounted on the exterior glass envelope of the reed switch and (3) an electromagnetic coil spirally wound around the permanent magnets, suffer from a deficiency in that the amount of power required to be supplied to an external coil is much greater to reach a first transition point of reed switch by increasing power than it is to reach a second transition point (which is the opposite of the first) of the reed switch by decreasing the power. This difference in forward and reverse switching is explained in large part, by hysteresis effect of the external magnetic field on the reeds of the reed switch. The ratios of the respective magnitudes of the power corresponding to the first and second transition points can vary between 2:1 and 4:1.

The operation of the conventional reed relay relative to an ECTS reed switch can be better understood by reference to FIGS. 6(a) and 6(b) which, respectively, illustrate the transition points of each as a function of the power supplied to the external coils. The zero (0) and one (1) values on the graphs correspond to a first and second switching position, respectively, of the reed switches of the relay and ECTS switch.

In FIG. 6(a) a line graph 91 indicates that with increasing power a reed switch relay will be shifted from the zero to the one position at a value $P_{11}$. With decreasing power, a line graph 93 indicates that the reed switch relay will be maintained in the one position until the power is reduced to a value of $P_{12}$. As stated above, the ratio of $P_{11}$ to $P_{12}$ for conventional reed switch relays has been found to vary between 2:1 and 4:1.

FIG. 6(b) illustrates in an analogous manner the transition points (such as illustrated by Line A of FIG. 5) of an ECTS reed switch. Line graphs 95 and 97 indicate, respectively, that the ECTS switch is changed from a zero position to a one position at a value $P_{13}$ for increasing power at a constant ambient temperature $T_1$ and is changed from a one position to a zero position at a value of $P_{14}$ for decreasing power at the temperature $T_1$. The ratio of $P_{13}$ to $P_{14}$ has been found to be reduced relative to the ratio of $P_{11}$ to $P_{14}$ for the ECTS reed switch of the present invention thereby providing an essentially hystersis free reed switch relay. Such a feature enables the use of an ECTS reed switch in accordance with the invention herein as a reed switch relay with highly reliable and predictable forward and reverse switching at an essentially constant power for the relay coil when the ECTS switch is maintained under constant ambient temperature conditions.

Another feature of the invention results from the ability to "change" the Curie temperature or induce "false Curie points" for the ferrite of the ECTS reed switch. This feature permits the ECTS reed switch in a temperature-indicating or control circuit to be interrogated to determine (1) if a signal initiated by the temperature-sensitive switch of such a circuit is in response to an O-T condition or merely a circuit malfunction such as open-circuit which would normally be indistinguishable electrically from an O-T condition when using a temperature-sensitive switch as shown in FIG. 1, and (2) if the signal has been accurately initiated at a predetermined temperature indicative of an O-T condition.

FIG. 7 illustrates a circuit incorporating an ECTS switch 83 which is comprised of an in-situ temperature-sensitive switch 81 and a coil 87 for providing signal(s) corresponding to a predetermined temperature condition such as an O-T condition and for providing means for interrogating the circuit as described above. The signal(s) corresponding to the predetermined temperature condition is provided by a temperature-sensitive switch 81 which is connected at one end to an indicator means 91. In the case of a battery temperature-sensing system, the indicator means 91 is normally located in the cockpit of an airplane to recieve and indicate the signal(s) from the temperature-sensitive switch 81. Such signals can be, for example, in the simplest form, the presence or absence of a closed circuit path through a single-pole, single-throw, temperature-sensitive reed switch to a power source 85 which is connected to the other side of temperature sensitive-switch 81. The condition of the circuit path of switch 81, of course, corresponds approximately to the ambient temperature of the battery relative to the transition point of the ferrite of the ECTS switch 83. The indicator means 91 can be of any conventional construction such as a relay operating the circuits for two indicating lights responsive to the presence or absence of a closedcircuit path through switch 81.

The interrogation of the ECTS switch 83 and the circuit therefor is accomplished by an interrogation means 89, which is coupled to one end of the coil 87 and can be a conventional circuit component such as a rheostat. The interrogation means 89 serves two functions. The first is to complete the circuit for the coil 87 and the power source 85 which is connected to the opposite side of the coil 87. The second is to adjust the current flow through coil 87 and thereby provide a variable magnetic field. As discussed in connection with FIG. 5 hereinabove, the influence of a variable magnetic field on the ferrite of the ECTS reed switch 83 is thought to induce false Curie points of the ferrite. In any event, the ultimate result is to vary the transition point of the temperature-sensitive reed switch 81. This permits the operator at any arbitrary time to test the mechanical and electrical operability of the circuit for the indicator means 91, switch 81, and power source 85, irrespective of the ambient temperature of the ferrite and battery, by merely adjusting the transition point of switch 81 to correspond to a temperature equal to the ambient temperature of the ferrite, thereby to artificially induce an indication on the indicator means 91.

A further feature of the invention embodied in this circuit is provided by the addition of an ammeter 93 between the temperature-sensitive switch 81 and the interrogation means 89 to indicate the magnitude of the current flowing through the coil 87. As has been discussed in regard to FIG. 5, the transition points for an ECTS switch in accordance with the invention herein has been found to vary linearly with the power supplied to the external coil thereof. From this relationship, it can be seen that the ammeter 93 could be calibrated in units which would correlate to the transition point of the switch or the Curie points of the ferrite. By adjustment of a rheostat interrogation means 89 and notation of the transition point of the switch 83, a direct indication at a remote location of the ambient temperature of the in-situ temperature-sensing switch 81 can be obtained. Also, this feature would permit the accuracy of the value so obtained to be easily verified by merely comparing it with an independently measured value for the ambient temperature.

As noted above, such a feature is highly desirable in temperature-monitoring circuits for applications such as aircraft batteries and fire alarm systems. It will be appreciated by those skilled in the art that this type of circuit can be employed in any environment where it is necessary to monitor the temperature conditions of an environment and to provide an interrogation means to determine the mechanical and electrical operability of the circuit.

While the invention has been shown and described with respect to specific embodiments thereof, it is not intended to be limited to the particular forms shown and described.

As described, devices constructed in accordance with preferred embodiments of the invention are comprised of a magnet circuit formed between a permanent magnet and a ferrite magnet; and an electromagnetic control means for controlling the opening and closing of said circuit. As will be recognized, alternative forms of the magnetic circuit include circuits comprised of ferrite magnet(s) with other magnetic flux generating means such as an electromagnetic coil. Similarly, permanent magnets with appropriate mechanical or electromechanical controls may be used in lieu of the electromagnetic control means shown herein for selectively generating a magnetic field in the vicinity of the magnetic circuit to control the opening and closing of the circuit.

The magnetic circuit is preferably associated with a magnetically responsive switching device such as a reed switch. However, other magnetically responsive switching and/or signaling devices such as a Hall-effect transistor, electromagnetic coil, etc. may be substituted therefor. Also, if the switching or signaling devices associated with the magnetic circuit is sensitive enough, the magnetic circuit need only be comprised of a ferrite magnet.

Accordingly, the appended claims are intended to cover all modifications within the spirit and scope of the invention herein described.

What we claim as new and desire to secure by Letters Patent of the U.S. is:

1. A method for intermittently interrogating a temperature-sensing circuit to verify the operative condition thereof at ambient temperatures which may be different from the in-situ ambient temperature during interrogation, said circuit comprising an in-situ reed switch and magnetic means associated therewith, including temperature-responsive ferrite means in magnetic circuit with the reed switch for establishing a magnetic field in the vicinity of the reed switch contacts, whereby said reed switch is operable, under the influence of the magnetic field, between open and closed positions at ambient temperatures above and below the Curie point temperature of the magnetic circuit, said method comprising the steps of selectively altering said magnetic field by an amount effective to establish temporarily a false Curie point temperature causing a reed switch to change from one to the other of said positions, and providing an indication of the position of said reed switch prior and subsequent to the alteration of the magnetic field.

2. The method of claim 1, wherein said magnetic field is altered by selectively generating a contributory magnetic field from an external magnetic souce.

3. The method of claim 2, wherein said external source comprises an electromagnetic coil disposed adjacent to said magnet means.

4. The method of claim 2, further comprising sensing a parameter indicative of the electrical input to said electromagnetic coil upon alteration of the magnetic field, and providing an indication of said electrical input, whereby said electrical input at the time when said reed switch changes from one position to the other may be correlated to an in-situ ambient temperature.

5. The method of claim 4, wherein said electrical input indication is provided at a location remote from said in-situ location.

6. The method of claim 2, wherein said in-situ ambient temperature is at or above the Curie point temperature for said magnetic circuit and said magnetic field is altered by increasing the flux contributed by said external magnetic source, thereby to establish a false Curie point temperature greater than the in-situ ambient temperature.

7. The method of claim 2, wherein said in-situ ambient temperature is less than the Curie point temperature for said magnetic circuit and said magnetic field is altered by reducing flux contributed by said external magnetic source, thereby to establish a false Curie point temperature less than the in-situ ambient temperature.

8. The method of claim 2, wherein said indication is provided at a location remote from said in-situ location.

* * * * *